United States Patent
Brunn et al.

(10) Patent No.: US 6,650,195 B1
(45) Date of Patent: Nov. 18, 2003

(54) OSCILLATOR WITH DIFFERENTIAL TUNABLE TANK CIRCUIT

(75) Inventors: Brian Taylor Brunn, Lakeville, MN (US); Ramesh Harjani, Minneapolis, MN (US)

(73) Assignee: Xilinx, Inc., San Jose, CA (US)

(*) Notice: Subject to any disclaimer, the term of this patent is extended or adjusted under 35 U.S.C. 154(b) by 118 days.

(21) Appl. No.: 09/918,752

(22) Filed: Jul. 30, 2001

(51) Int. Cl.$^7$ ............................................. H03B 1/00
(52) U.S. Cl. .............. 331/177 V; 331/115; 331/117 R; 331/116 FE
(58) Field of Search ........................ 331/117 R, 116 FE, 331/115, 177 V, 167, 172

(56) References Cited

U.S. PATENT DOCUMENTS

| | | | |
|---|---|---|---|
| 4,063,193 A | | 12/1977 | Wilcox |
| 4,270,102 A | | 5/1981 | Gawler et al. |
| 4,378,531 A | * | 3/1983 | Gawler .................. 331/117 R |
| 5,371,475 A | | 12/1994 | Brown |
| 5,373,264 A | | 12/1994 | Higgins, Jr. |
| 5,635,879 A | | 6/1997 | Sutardja et al. |
| 5,714,911 A | | 2/1998 | Gilbert |
| 5,850,163 A | | 12/1998 | Drost et al. |
| 5,920,235 A | | 7/1999 | Beards et al. |
| 6,008,701 A | | 12/1999 | Gilbert |
| 6,016,082 A | | 1/2000 | Cruz et al. |
| 6,046,647 A | | 4/2000 | Nelson |
| 6,081,167 A | | 6/2000 | Kromat |
| 6,175,285 B1 | * | 1/2001 | Gabara .................. 331/117 R |
| 6,201,450 B1 | | 3/2001 | Shakiba et al. |
| 6,249,192 B1 | * | 6/2001 | Gabara et al. .......... 331/117 R |

OTHER PUBLICATIONS

Ali Hajimiri and Thomas H. Lee; "The Design of Low Noise Oscillators" Kluwer Academic Publishers, 1999, Third Printing 2000, Chapter 6, pp. 111–128, ISBN 0-7923-8455-5.

Marc Tiebout "Low–Power Low–Phase–Noise Differentially Tuned Quadrature VCO Design in Standard CMOS"; IEEE Journal of Solid–State Circuits, Jul. 2001, vol. 36, No. 7; pp. 1018–1024.

* cited by examiner

Primary Examiner—Michael Tokar
Assistant Examiner—Lam T. Mai
(74) Attorney, Agent, or Firm—Eduardo E. Drake; Schwegman, Lundberg, Woessner, Kluth

(57) ABSTRACT

Many electronic devices, such as computers and printers, communicate data to each other over wireline or wireless communications links. One component vital to such communications is a voltage-controlled oscillator (VCO)—a circuit that outputs an oscillating signal having an oscillation frequency based on a control voltage. Conventional VCOs adjust frequency based on a single control voltage input, which makes them vulnerable to unintended changes in the control voltage (and power-supply voltages relative to the control voltage.) These voltage changes cause frequency deviations that can make communications between devices less reliable. Accordingly, the present inventors devised a VCO that includes differential frequency control—frequency control based on the difference of two control voltages. The VCO, which uses a differentially tunable impedance, rejects common-mode noise (undesirable voltage variations that affect both control voltages) and thus bolsters reliability of communication circuits, such as phase-lock loops, receivers, transmitters, transceivers, and other devices that use it

31 Claims, 5 Drawing Sheets

OSCILLATOR WITH DIFFERENTIAL TUNABLE TANK CIRCUIT

TECHNICAL FIELD

The present invention concerns voltage-controlled oscillators, particularly voltage-controlled oscillators used to facilitate communications between electronic devices or circuits.

BACKGROUND

Today there are a wide variety of computer and telecommunications devices, such as personal computers (PCs), mobile telephones, and personal data assistants (PDAs), that need to share information with each other. Generally, this information is communicated from a sending device to a receiving device.

The sending device generally has the data in the initial form of a set of digital words (sets of ones and zeros). In the sending device, a transmitter circuit converts each word into a sequence of electrical pulses, with each pulse timed according to a data clock, and transmits the timed sequence of pulses through a cable, circuit board, or other medium to the receiving device. The receiving device includes a receiver circuit that first determines the timing of the pulses and then identifies each of the pulses in the signal as a one or zero, enabling it to reconstruct the original digital words.

A key component in both the transmitter and the receiver is a voltage-controlled oscillator—a circuit that produces a signal that varies back and forth between two voltage levels at a frequency based on an input control voltage. The transmitter uses a VCO to place digital information into a high-frequency carrier signal, and the receiver uses a VCO to separate the digital information from the high-frequency carrier signal. Thus, reliable and precise VCO operation is critical to transmission and reception of digital information.

One problem the present inventors identified in conventional VCOs is the use of single-ended control voltages. In other words, conventional VCOs include only one input point for receiving a control voltage. The single-ended control voltage forces VCO oscillation frequencies to deviate randomly from desired frequencies in response to unintended, yet inevitable, variations in the control voltage (or power-supply voltages relative to the control voltage.) For example, for a transmitter VCO intended to produce an oscillation frequency of 2.4 Gigahertz (2.4 billion oscillations per second), control-voltage variations, stemming from inevitable power-supply fluctuations, may cause the frequency to vary from 2.4001 Gigahertz to 2.3992 Gigahertz to 2.4010 Gigahertz. Similarly, a receiver VCO frequency will also vary based on its own local control voltage. Such frequency deviations can make it more difficult to reliably communicate data between electronic devices.

SUMARY

Accordingly, there is a need for better voltage-controlled oscillators.

To address these and other needs, the present inventors devised an exemplary voltage-controlled oscillator (VCO) circuit that includes two frequency-control inputs and a differentially tunable impedance that varies according to the voltage difference F between the frequency-control inputs. The differentially tunable impedance rejects noise (undesirable voltage variations) common to both of the frequency-control inputs and thus provides the VCO with a noise immunity, known as common-mode rejection, that is not available in conventional VCOs with single control inputs.

Other aspects of the invention include phase-lock loops, receivers, transmitters, and transceivers that incorporate the exemplary VCO. Additionally, various embodiments of the invention comply with Bluetooth and/or other wireless communications standards.

DETAILED DESCRIPTION OF EXEMPLARY EMBODIMENTS

The following detailed description, which references n and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

Exemplary Oscillator with Differential Frequency Control

Figure 1:
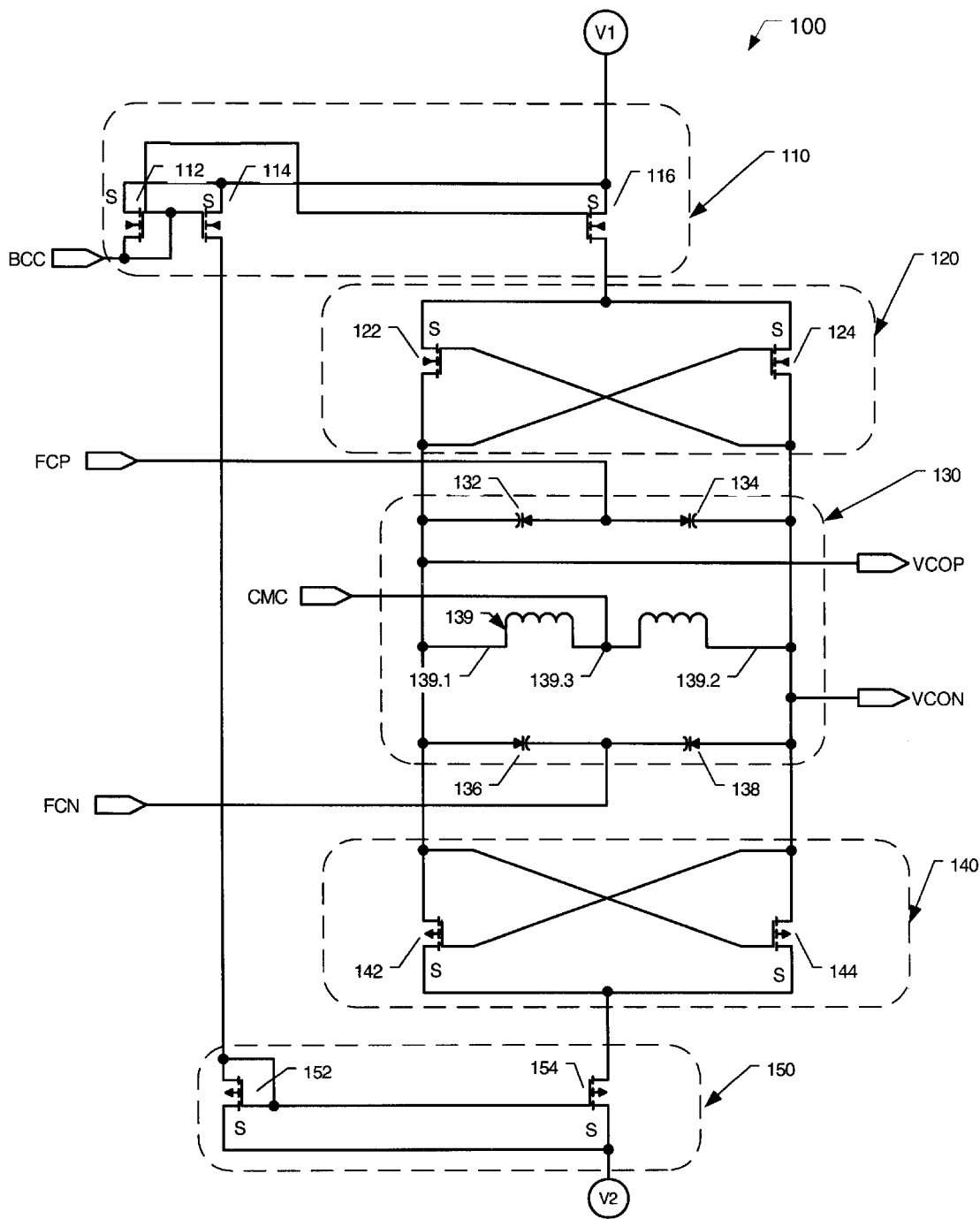
FIG. 1 is a schematic diagram of an exemplary voltage-controlled oscillator 100 incorporating teachings of the invention.

FIG. 1 shows an exemplary voltage-controlled oscillator 100, which incorporates teachings of the present invention. Oscillator 100 includes supply nodes V1 and V2, a bias-current-control input BCC, differential frequency-control inputs FCP and FCN, a common-mode control input CMC, differential oscillator outputs VCOP and VCON, an adjustable current source 110, an upper negative-impedance circuit 120, a differentially tunable tank circuit 130, a lower negative impedance circuit 140, and an adjustable current sink 150.

More particularly, adjustable current source 110 includes p-channel field-effect transistors 112, 114, and 116. Like the other transistors-in this exemplary circuit, each of transistors 112, 114, and 116 includes a control node known as a gate and two non-control nodes: known as a source and a drain. (In FIG. 1, the gates are designated by the three short vertical dashes along with the adjacent vertical line segment, and the source is designated with the letter S; the drain is opposite the source and carries no specific designation.) The sources of transistors 112, 114, and 116 are coupled to supply node V1, and the gates of transistors 112, 114, and 116 are coupled together. The gate of transistor 112 is coupled also to its drain and to bias-current-control input BCC. The interconnection of transistors 112 and 116 form a current mirror, which supplies a bias current based on bias-current-control input BCC through the drain of transistor 116 to negative-impedance circuit 120.

Negative-impedance circuit 120 includes matched p-channel field-effect transistors 122 and 124, which have their sources coupled together and to the drain of transistor 116. The gate of transistor 122 is coupled to the drain of transistor 124, and the gate of transistor 124 is coupled similarly to the drain of transistor 122, defining a cross-coupled differential pair. Also coupled to the drains of transistors 122, and 124 is differentially tunable tank circuit 130.

Tank circuit 130 includes four matched accumulation-mode varactors, or variable capacitors, 132, 134, 136, and 138; and a center-tapped inductor 139. Varactors 132-138— which collectively define a differentially tunable impedance, or more precisely a differentially tunable capacitance—each have respective positive and negative nodes, or terminals. (The figure designates each positive node as the base of the triangle in the pictured circuit symbol.) The positive nodes of varactors 132 and 134 are coupled together and to positive frequency-control input FCP, and the negative nodes of varactors 132 and 134 are coupled respectively to oscillator outputs VCOP and VCON. Varactors 136 and 138 have their negative nodes coupled together and to frequency control input FCN, and their positive nodes coupled respectively to oscillator outputs VCOP and VCON. Center-tapped inductor 139 has end nodes 139.1 and 139.2 coupled to respective oscillator outputs VCOP and VCON, and a tap node 139.3 coupled to common-mode control input CMC. In this exemplary embodiment, tap node 139.3 divides inductor 139 into two substantially equal inductances.

Lower negative-impedance circuit 140 includes matched n-channel field-effect transistors 142 and 144. Like transistors 122 and 124 in negative-impedance circuit 120, transistors 142 and 144 form a cross-coupled differential pair. However, in the exemplary embodiment, transistors 142 and 144 are roughly half the size of transistors 122 and 124 (in terms of channel width-to-length ratio) to ensure similar transconductances. In particular, the gate of transistor 142 is coupled to the source of transistor 144; the gate of transistor 144 is coupled to the source of transistor 142, and the sources of transistors 142 and 144 are coupled together and to the drain of an n-channel field effect transistor 154 within adjustable current sink 150.

In addition to transistor 154, adjustable current sink 150 includes an n-channel field-effect transistor 152. Transistors 152 and 154 are coupled together to form a one-to-five current mirror, with transistor 152 mirroring the bias current established in current source 110 to transistor 154. In terms of specific connections, the gate and drain of transistor 152 are coupled together and to both the drain of transistor 114 (at top of the figure) and the gate of transistor 154, and the sources of transistors 152 and 154 are coupled together and to supply node V2.

In general operation ostcillator 100 produces a differential oscillating signal at differential outputs VCOP and VCON, with the frequency of oscillation determined by the differential tuning voltage, that is, the voltage difference between frequency-control inputs FCP and FCN. As tank circuit 130 changes the voltages at outputs VCOP and VCON, transistors 122 and 144 switch on and then off in tandem, and transistors 124 and 142 switch off and then on in tandem, continually sourcing and sinking current to compensate for losses within the tank circuit and thereby sustaining oscillations. Increasing the differential tuning voltage (FCP—FCN) increases the oscillation frequency, and decreasing the tuning voltage decreases it.

More particularly, increasing the differential tuning voltage entails increasing the voltage at frequency-control input FCP and decreasing the voltage at frequency-control input FCN. A voltage increase at frequency-control input FCP, which controls the voltage at the positive nodes of varactors 132 and 134, decreases the average reverse bias voltage on varactors 132 and 134 and thus decreases their combined capacitance. A voltage decrease at frequency-control input FCN reduces the average reverse bias voltage on varactors 136 and 138, and thus decreases their combined capacitance. As a result of the decreased varactor capacitances, the oscillation frequency, which is inversely proportional to the square root of the inductance capacitance product (LC), increases.

Conversely, decreasing the differential tuning voltage entails decreasing the voltage at frequency-control input FCP and increasing the voltage at frequency-control input FCN. Decreasing the FCP voltage increases the average reverse bias voltage on varactors 132 and 134 and thus increases their combined capacitance. Increasing the FCN voltage increases the average reverse bias voltage on varactors 136 and 138 and thus increases their combined capacitance. The increase in total capacitance decreases the oscillation frequency.

Notably, this differential tuning mechanism also rejects common-mode voltages, such as power-supply noise, at differential frequency-control inputs FCP and FCN. Positive voltage changes at input FCP increase the capacitance of varactors 132 and 134, whereas positive voltage changes at input FCN decrease the capacitance of varactors 136 and 138. Thus, assuming ideal matching of all four varactors, a given positive voltage change at both inputs FCP and FCN has no effect on the total capacitance of the tank circuit and thus has no effect on the oscillation frequency. Similarly, any negative voltage change occurring at both inputs FCP and FCN decreases the capacitance of varactors 132 and 134, and increases the capacitance of varactors of 136 and 138. Thus, the exemplary oscillator provides common-mode rejection through matching or counterbalancing any increase in capacitance in one portion of the total capacitance, or more generally, total impedance, with a corresponding decrease in another portion. The inventors contemplate that similar counterbalancing mechanisms could be formed using two inductances and/or combined inductance capacitances.

In addition to the frequency-control inputs FCP and FCN, operation of oscillator 100 is also affected by bias-current-control input BCC and common-mode-control inputs CMC. Bias-current-control input BCO determines the magnitude of the current sourced by current source 110 and sunk by current sink 160, and thus determines the magnitude of the negative impedances presented by negative impedance circuits 120 and 140. (As known in the art, the bias current governs the transconductance of the transistors in each cross-coupled differential pair, and the magnitude of the negative impedance is approximately half this transconductance.) The negative impedances in circuits 120 and 140 respectively compensates for losses in the tank circuit to sustain oscillation of the signals at differential outputs VCOP and VCON.

Common-mode-control input CMC is provided to compensate for inevitable mismatches between current source 110 and current sink 150. In operation, source 110 and sink 150 allow the oscillator to essentially float between the power-supply voltages, effectively isolating the oscillator from the power supply. In general, common-mode-control should provide a voltage midway between the voltages at the frequency-control inputs FCP and FCN.

Some other embodiments incorporating teachings of exemplary oscillator 100 may use other types of transistors, such as bipolar junction transistors, or alter other aspects of the exemplary embodiment. For examples, some embodiments can use other types of current sources, sinks, or negative-impedance circuits. Still other embodiments can place a parallel set of reversed varactors in parallel or in series with a fixed capacitance to constrain the tuning range of the oscillator. Other embodiments could also provide an arrangement of opposing variable inductances coupled to fixed or tunable capacitances. Other embodiments may also implement tapped inductor 139 as two inductors.

Exemplary Phase-Locked Loop

Figure 2:
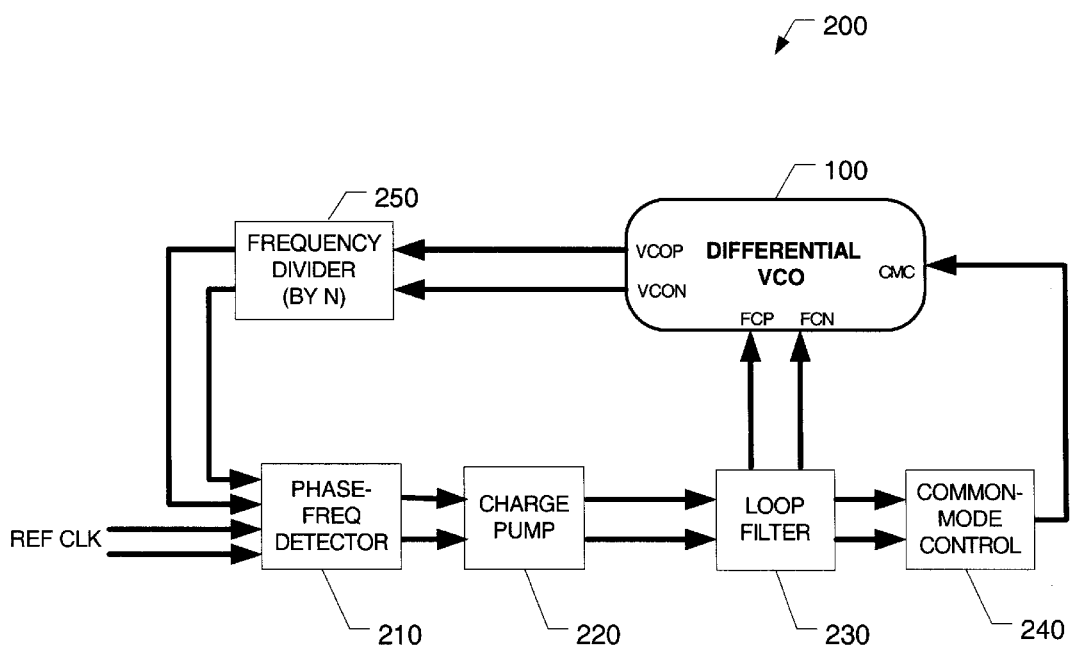
FIG. 2 is a block diagram of an exemplary phase-lock loop 200 incorporating voltage-controlled oscillator 100.

FIG. 2 shows an exemplary differential phase-lock loop 200 incorporating differential voltage-controlled oscillator 100. Phase-lock loop 200, which generally operates in a conventional manner, further includes a phase-frequency detector 210, a charge pump 220, a loop filter 230, a common-mode control circuit 240, and a frequency divider 250. Common-mode control circuit 240 provides a voltage midway between the loop filter output voltages. Phase-lock loop 200 includes a differential reference-clock input REF-CLK for receiving a reference clock signal.

Exemplary Wireless Transceiver

Figure 3:
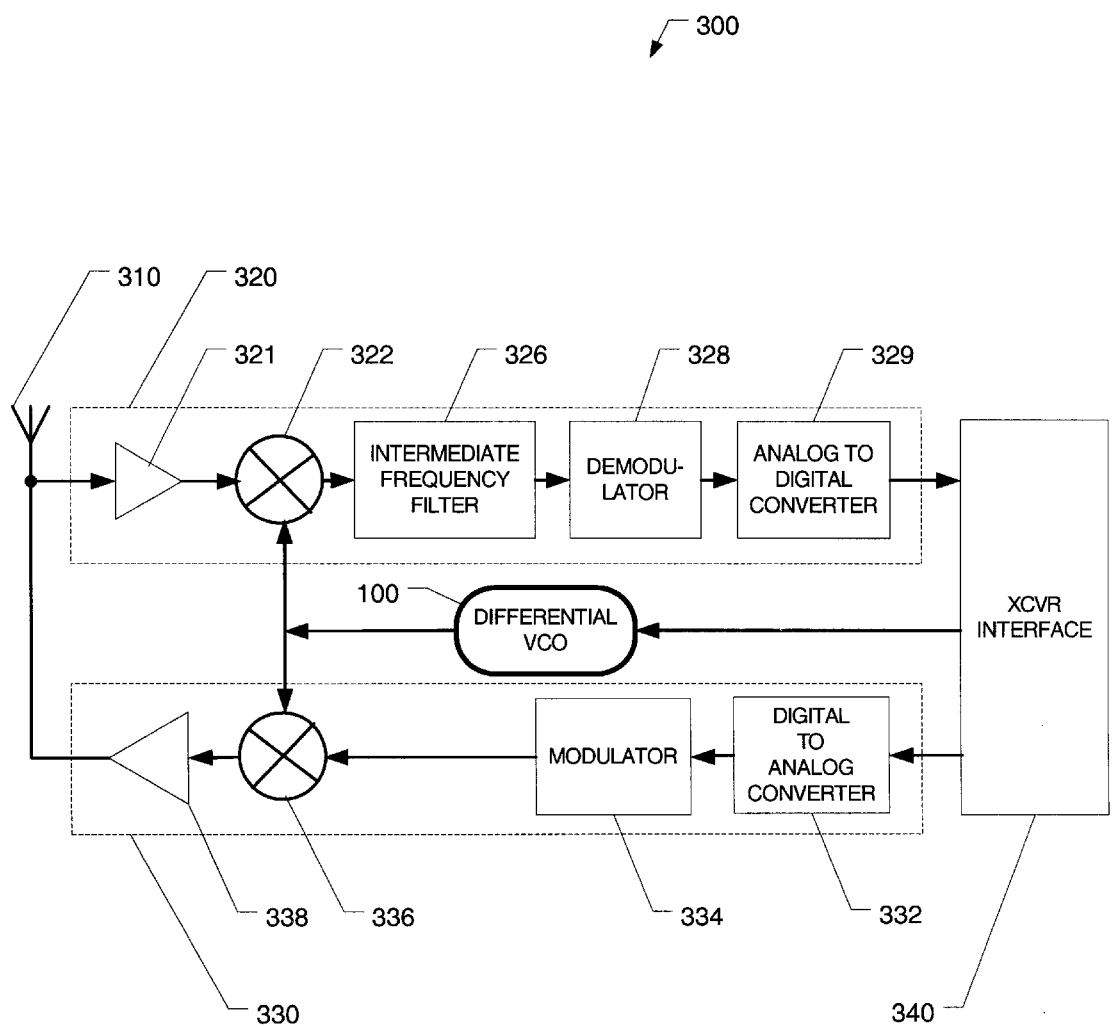
FIG. 3 is a block diagram of an exemplary transceiver 300 incorporating phase-lock loop 200.

FIG. 3 shows an exemplary transceiver 300 that incorporating exemplary amplifier 100 of FIG. 1. In particular, transceiver 300, which generally operates according to conventional principles, includes an antenna 310, a receiver 320, a transmitter 330, and a digital transceiver (XCVR) interface 340. Receiver 320 includes an amplifier 321, a mixer (or down-converter) 322, an intermediate-frequency (IF) filter 326, a demodulator 328, an analog-to-digital converter 329. Transmitter 330 comprises a digital-to-analog converter 332, a modulator 334, an up-converter 336, and an output amplifier 338. Receiver 320 and transmitter 330 share antenna 310 and a voltage-controlled oscillator 324; however, other embodiments provide separate antennas and oscillators. The exemplary transceiver complies with one or more versions of the Bluetooth specification and thus receives and transmits signals in the 2.4 Gigahertz band. However other embodiments use different communication bands.

Although the exemplary embodiment shows a wireless transceivers, the scope of the invention also includes wireline transceivers.

Exemplary Field Programmable Integrated Circuit

Figure 4:
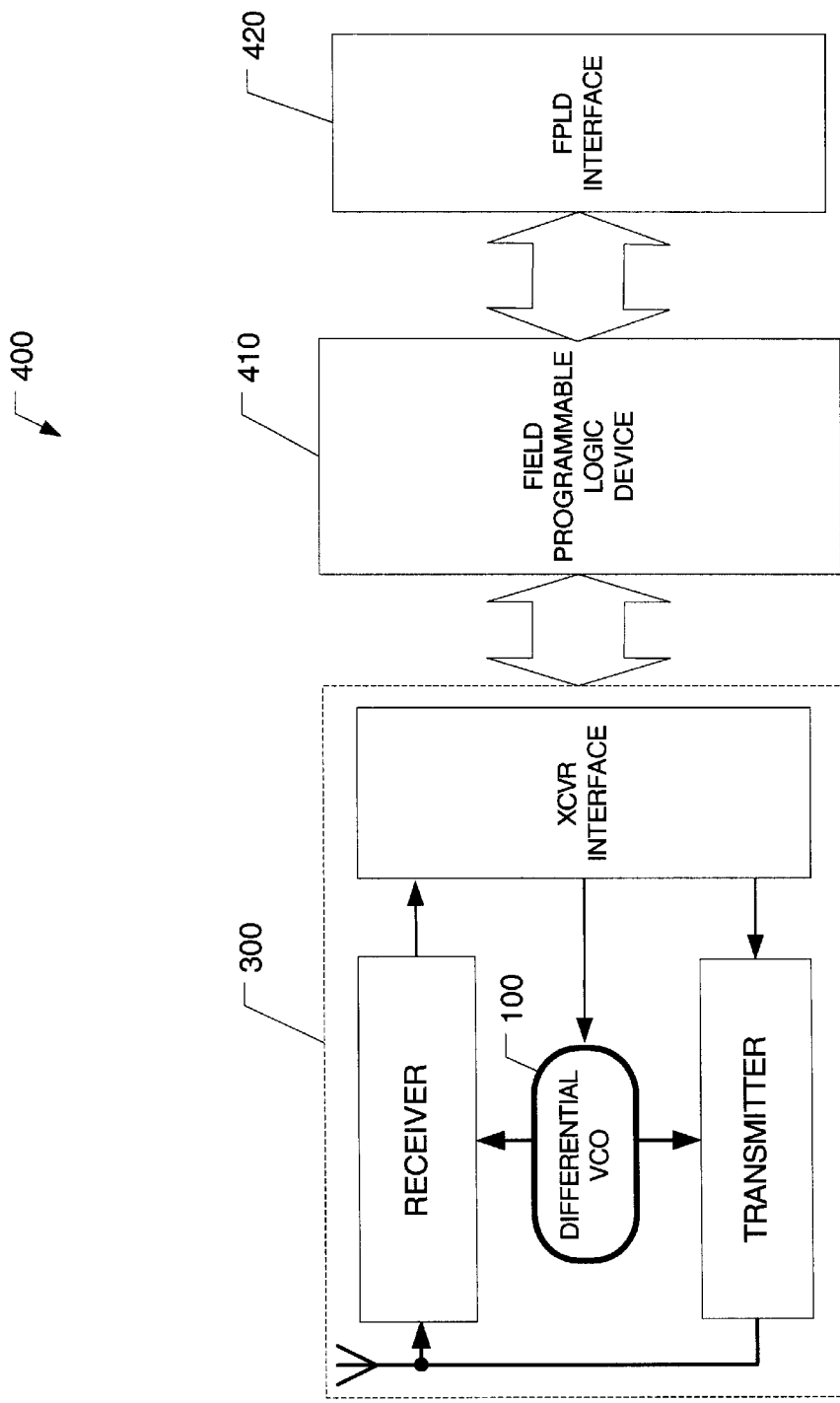
FIG. 4 is a block diagram of an exemplary system 400 incorporating transceiver 300.

FIG. 4 shows a block diagram of an exemplary field-programmable integrated circuit 400 including exemplary wireless transceiver 300 (of FIG. 3.) Integrated circuit 400 also includes a field-programmable logic device (FPLD) 420, such as a field-programmable gate array (FPGA), and an FPLD interface 430. Although not show for clarity of illustration, various embodiments of logic device 420 includes one or more individually and collectively configurable logic blocks, as well as an on board processor and memory, which facilitate configuration of the device to perform desirable signal and data processing functions. FPLD Interface 430 provides conventional communications and program support capabilities.

Notably, the incorporation of wireless transceiver 400 also makes it possible to wirelessly program or reconfiguration the logic device 420 using a compatible wireless device with a conventional capability for programming field-programmable logic devices.

Exemplary System

Figure 5:
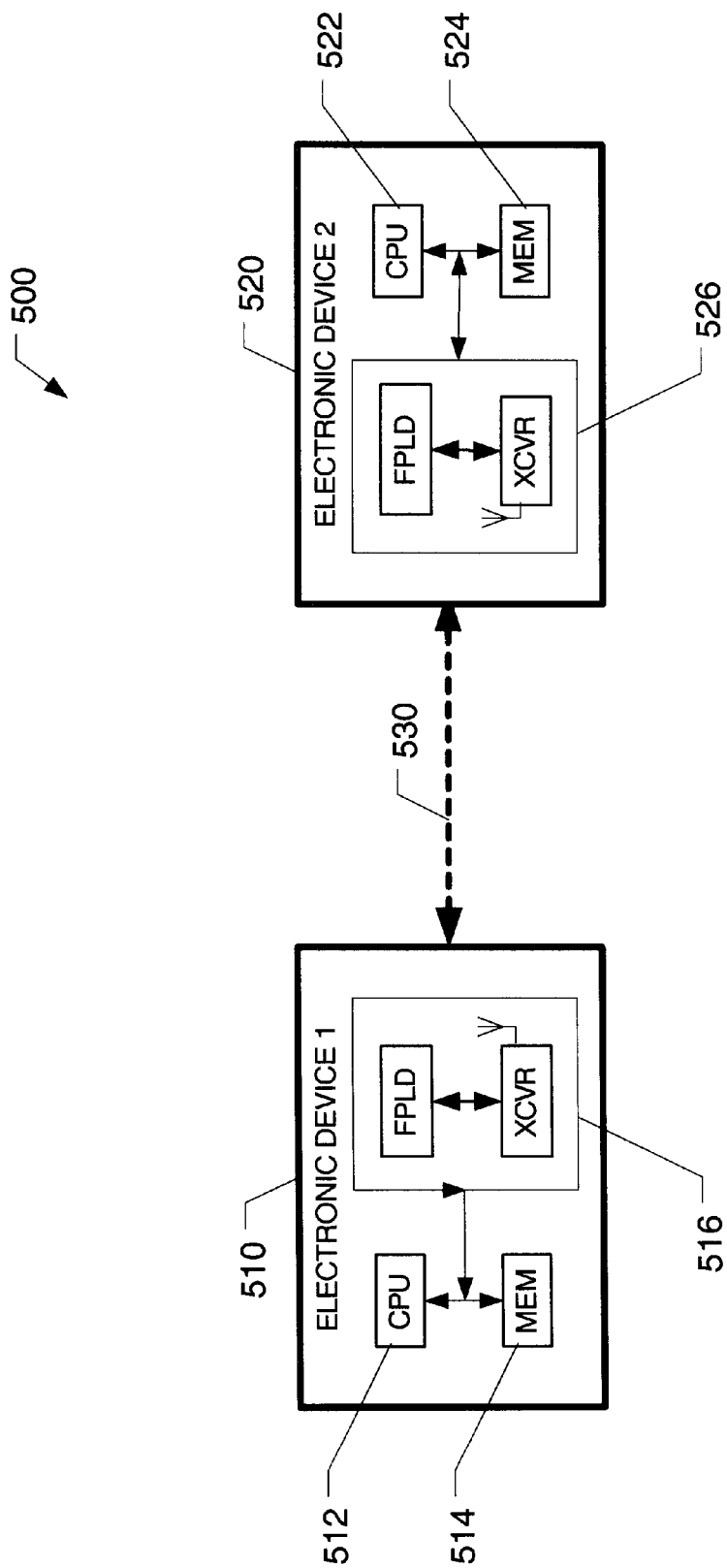
FIG. 5 is a block diagram of an exemplary programmable logic device 500 incorporating transceiver 300.

FIG. 5 shows an exemplary system 500 including two or more electronic devices that incorporate field-programmable integrated circuit 400 of FIG. 4. In particular, system 500 includes electronic devices 510 and 520 and a wireless communications link 530. Devices 510 and 520 include respective processors 512 and 522, memories 514 and 524, and integrated programmable logic circuits 516 and 526. Circuits 516 and 526 incorporate the teachings of exemplary integrated circuit 400 in FIG. 3 and thus provide devices 510 and 520 with capability for communicating over communications link 530 to each other (or to one or more other suitably equipped devices. Communications link 530 carries voice and/or digital data on a 2.4 Gigahertz carrier signal, according to a version of the Bluetooth communications protocol. However, other embodiments may use other communications protocols.

Devices 510 and 520 can assume a wide variety of forms. For example, in various embodiments, one or both of the devices are a computer, monitor, mouse, key board, printer, scanner, fax machine, network communications device, personal digital assistant, cordless telephone, headset, mobile telephone, vehicle, appliance, entertainment equipment, and industrial controller. Indeed, virtually any device that currently communicates with another device wirelessly or via a cable or that would be more useful with such communication could incorporate teachings of the present invention.

Conclusion

In furtherance of the art, the inventors have presented an exemplary voltage-controlled oscillator (VCO) that includes differential frequency-control inputs and a differentially tunable impedance. The differentially tunable impedance rejects noise common to both the frequency-control inputs and thus provides the VCO circuit with a noise immunity not found in conventional, single-ended VCOs. Additionally, the exemplary oscillator is coupled respectively to upper and lower supply nodes via a current source and a current sink which provide power-supply isolation. VCOs having this form of noise immunity and/or power-supply isolation ultimately promise to improve performance of not only phase-locked loops, receivers, transmitters, and transceivers, but also programmable integrated circuits, electronic devices, and systems that incorporate them.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. An oscillator comprising:
   first and second supply nodes;
   a differentially tunable tank circuit;
      a first negative-resistance circuit coupled between the tank circuit and the first supply node;
      a second negative-resistance circuit coupled between the tank circuit and the second supply node;
      a current source coupled between the first negative-resistance circuit and the first supply node; and
      a current sink coupled between the second negative-resistance circuit and the second supply node.

2. The oscillator of claim 1, wherein the differentially tunable tank circuit includes: an inductance; and
   a differentially tunable capacitance coupled to the inductance.

3. The oscillator of claim 2, wherein the oscillator includes first and second outputs and the differentially tunable capacitance comprises:

first and second control inputs;
first and second varactors coupled respectively between the first output and the first control input and between the second output and the first control input; and
third and fourth varactors coupled respectively between the first output and the second control input and between the second output and the second control input.

4. The oscillator of claim 3, wherein each of the varactors have positive and negative nodes, with the positive nodes of the first and second varactors coupled to the first control input and the negative nodes of the third and fourth varactors coupled to the second control node.

5. The oscillator of claim 3, wherein the inductance is coupled in parallel to the differentially tunable capacitance.

6. The oscillator of claim 3, wherein the inductance comprises a center-tapped inductance having first and second end nodes and a center tap, with the first and second end nodes coupled respectively to the first and second outputs, and the center tap coupled to receive a common-mode control voltage.

7. The oscillator of claim 1, wherein the first negative-impedance circuit comprises a first differential cross-coupled pair of transistors and the second negative-impedance circuit comprises a second differential cross-coupled pair of transistors.

8. The oscillator of claim 7, wherein the first differential cross-coupled pair of transistors consists of transistors of a first size and the second differential cross-coupled pair of transistors consists of transistors of a second size different from the first.

9. The oscillator of claim 1, further comprising a bias-current-control input coupled to the current source and the current sink.

10. A phase-locked loop comprising:
a phase-detector having a first and second inputs and first and second outputs;
a charge pump coupled to first and second outputs of the phase detector;
a common-mode voltage circuit coupled to the charge pump;
the oscillator of claim 1 coupled to the common-mode voltage circuit;
a frequency divider coupled between first and second outputs of the tunable oscillator and the first and second inputs of the phase detector.

11. A transceiver comprising the phase-locked loop of claim 10.

12. A programmable integrated circuit comprising the transceiver of claim 11.

13. An oscillator comprising:
a tank circuit including an inductance and a differentially tunable capacitance coupled to the inductance;
a negative-impedance circuit coupled to the tank circuit; and
first and second outputs;
wherein the differentially tunable capacitance comprises:
first and second control inputs;
first and second varactors coupled respectively between the first output and the first control input and between the second output and the first control input; and
third and fourth varactors coupled respectively between the first output and the second control input and between the second output and the second control input.

14. The oscillator of claim 13, wherein the negative-impedance circuit comprises a differential cross-coupled pair of transistors.

15. A phase-locked loop comprising:
a phase-detector having a first and second inputs and first and second outputs;
a charge pump coupled to first and second outputs of the phase detector;
a common-mode voltage circuit coupled to the charge pump;
the oscillator of claim 13, coupled to the common-mode voltage circuit;
a frequency divider coupled between first and second outputs of the tunable oscillator and the first and second inputs of the phase detector.

16. A transceiver comprising the phase-locked loop of claim 15.

17. A programmable integrated circuit comprising the transceiver of claim 16.

18. An oscillator comprising:
first and second supply nodes;
first and second differential tuning inputs for receiving first and second tuning voltages;
a differentially tunable tank circuit having first and second output nodes coupled between the first and second supply nodes and to the first and second differential turning inputs, with the tank circuit including:
a differentially tunable impedance means for providing an impedance based on a difference between the first and second tuning voltages.

19. The oscillator of claim 14, further comprising:
a first negative impedance circuit coupled between the first supply node and the differentially tunable tank circuit; and
a second negative impedance circuit coupled between the second supply node and the differentially tunable tank circuit.

20. The oscillator of claim 18, further comprising:
a current source coupled between the first supply node and the differentially tunable tank circuit; and a current sink coupled between the second supply node and the differentially tunable tank circuit.

21. The oscillator of claim 18, further comprising a common-mode control input, coupled to the differentially tunable impedance means, for receiving a common-mode control voltage.

22. An oscillator comprising:
first and second supply nodes;
a tank circuit;
a current source coupled between the tank circuit and the first supply node; and
a current sink coupled between the tank circuit and the second supply node.

23. The oscillator of claim 22, wherein the tank circuit comprises a differentially tunable impedance means for providing an impedance based on a difference between first and second tuning voltages.

24. A transceiver comprising the oscillator of claim 22.

25. A tunable capacitance circuit comprising:
first and second nodes;
first and second control inputs for receiving first and second complementary control voltages;
first and second varactors coupled respectively between the first node and the first control input and between the second node and the first control input; and third and fourth varactors coupled respectively between the first node and the second control input and between the second node and the second control input.

26. The tunable capacitance circuit of claim 25, wherein each of the varactors have positive and negative nodes, with the positive nodes of the first and second varactors coupled to the first control input and the negative nodes of the third and fourth varactors coupled to the second control node.

27. A method of tuning an oscillation frequency of an oscillator having a total capacitance, comprising:
proving first and second control signals;
changing a first portion of the total capacitance based on the first control signal; and
changing a second portion of the total capacitance based on the second control signal; and
wherein changing the first portion based on the first control signal comprises changing the bias voltage on a varactor.

28. The method of claim 27, wherein changing the second portion based on the second control signal comprises changing the bias voltage on a varactor.

29. The method of claim 27, wherein the first and second control signals are complementary.

30. A method of operating an oscillator having a total capacitance, the method comprising:
changing a first portion of the total capacitance in response to a noise signal; and
offsetting at least a portion of the change in the first portion of the total capacitance; and wherein offsetting at least a portion of the change in the first portion of the total
capacitance comprises increasing or decreasing a second portion of the total capacitance in response to the noise signal.

31. The method of claim 30, wherein offsetting at least a portion of the change in the first portion comprises offsetting substantially all of the change in the first portion.

* * * * *